(12) United States Patent
Ohneda et al.

(10) Patent No.: US 7,600,140 B2
(45) Date of Patent: *Oct. 6, 2009

(54) LOGIC CIRCUIT SYSTEM AND METHOD OF CHANGING OPERATING VOLTAGE OF A PROGRAMMABLE LOGIC CIRCUIT

(75) Inventors: Taku Ohneda, Kanagawa-ken (JP); Shinichi Kanno, Kanagawa-ken (JP); Masaya Tarui, Kanagawa-ken (JP); Yukimasa Miyamoto, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 168 days.

This patent is subject to a terminal disclaimer.

(21) Appl. No.: 11/778,404

(22) Filed: Jul. 16, 2007

(65) Prior Publication Data

US 2008/0016376 A1 Jan. 17, 2008

Related U.S. Application Data

(63) Continuation of application No. 10/960,707, filed on Oct. 8, 2004, now Pat. No. 7,330,985.

(30) Foreign Application Priority Data

Oct. 8, 2003 (JP) ............................. 2003-349430
Aug. 5, 2004 (JP) ............................. 2004-228919

(51) Int. Cl.
*G06F 1/32* (2006.01)
(52) U.S. Cl. ...................... 713/320; 713/100; 713/501; 361/187; 327/47
(58) Field of Classification Search ................. 713/320, 713/100, 501; 361/187; 327/47
See application file for complete search history.

(56) References Cited

U.S. PATENT DOCUMENTS

| 4,740,721 | A  | 4/1988  | Chung et al.      |
| 5,946,219 | A  | 8/1999  | Mason et al.      |
| 6,480,954 | B2 | 11/2002 | Trimberger et al. |
| 6,600,959 | B1 | 7/2003  | Coulman et al.    |
| 6,614,258 | B2 | 9/2003  | Song              |
| 6,703,859 | B2 | 3/2004  | Kumamoto          |
| 6,924,663 | B2 | 8/2005  | Masui et al.      |
| 7,028,211 | B2 | 4/2006  | Mantani           |
| 7,076,595 | B1 | 7/2006  | Dao et al.        |
| 7,116,131 | B1 | 10/2006 | Chirania et al.   |

FOREIGN PATENT DOCUMENTS

JP    2001-202236    7/2001

*Primary Examiner*—Thuan N Du
(74) *Attorney, Agent, or Firm*—Oblon, Spivak, McClelland, Maier & Neustadt, L.L.P.

(57) ABSTRACT

A logic circuit system with power consumption that is reduced by automatically varying the clock frequency and operating voltage according to processing capability imposed on programmable logic circuits. The programmable logic circuits are capable of achieving plural circuit functions dynamically and can change realized circuit functions during operation. In addition, the system has a voltage supply portion for supplying a voltage to the programmable logic circuits, a clock signal supply portion for supplying a clock signal to the programmable logic circuits, a change control portion for changing the circuit functions realized by the programmable logic circuits to any one of the circuit functions, an operation time measuring portion for measuring the operation times of the programmable logic circuits to perform processing to achieve the circuit functions, respectively, and a clock-and-voltage determination portion for determining the frequency of the clock signal and the voltage, using the operation times.

4 Claims, 14 Drawing Sheets

LOGIC CIRCUIT SYSTEM AND METHOD OF CHANGING OPERATING VOLTAGE OF A PROGRAMMABLE LOGIC CIRCUIT

CROSS-REFERENCE TO RELATED APPLICATIONS

This application is a continuation application of Ser. No. 10/960,707, filed Oct. 8, 2004, which is based upon and claims the benefit of priority from Japanese Patent Applications No. 2003-349430, filed on Oct. 8, 2003, and No. 2004-228919, filed on Aug. 5, 2004, the entire contents of each of which are incorporated herein by reference.

BACKGROUND OF THE INVENTION

1. Field of the Invention

The present invention relates to a logic circuit system utilizing programmable logic circuits that can reconfigure their circuit configuration and change their circuit functions during operation.

2. Description of the Related Art

Where a circuit performing processing consisting of plural process steps is made up of one integrated circuit, the processing capability of some portions of the integrated circuit are superfluous. Correspondingly, excess electric power is consumed, because the operating speed of the whole integrated circuit is set to be capable of performing the processing of the process step that requires the highest processing capability in spite of the fact that there are process steps requiring only low processing capability.

An effective technique of reducing the power consumption of an integrated circuit is to lower the operating voltage and the frequency of the clock signal (i.e., clock frequency). However, where the operating voltage is lowered, the upper limit of the operable clock frequency is reduced. Where the clock frequency is lowered, the processing capability is reduced.

In recent years, programmable logic circuits capable of changing their circuit functions during operation have been proposed. Such a programmable logic circuit can change the circuit configuration of the whole or part of the circuit during operation of the circuit. Programmable logic circuits include FPGAs (field programmable gate arrays) capable of changing their logic configurations at high speed and DPGAs (dynamically programmable gate arrays). These arrays are hereinafter referred to simply as "programmable logic circuits".

Conventionally, a technique in which unit circuits for executing processing steps corresponding to plural process steps, respectively, are configured on a programmable logic circuit in a time-shared manner to process all the process steps has been proposed in Japanese Patent Application (KOKAI) No. 2001-202236.

With the aforementioned technique for operating a programmable logic circuit in a time-shared manner, a surplus of processing capability can be reduced by operating unit circuits corresponding to process steps requiring high processing capability for long periods and by operating unit circuits corresponding to process steps requiring only low processing capability for short periods.

With this technique, however, it is necessary to appropriately set the proportions of the operating times of the unit circuits in advance. That is, it is not assumed that the technique copes with a case where the processing capabilities respectively imposed on the unit circuits vary dynamically.

SUMMARY OF THE INVENTION

Embodiments of the invention provide a logic circuit system capable of reducing power consumption by automatically varying clock frequency and operating voltage according to processing capabilities imposed on a programmable logic circuit.

According to one aspect of the present invention, there is provided a logic circuit system comprising a programmable logic circuit having a circuit configuration that is reconfigurable during operation, a circuit configuration information supplier configured to supply circuit configuration information about plural unit circuits to said programmable logic circuit a change controller configured to change the circuit configuration of said programmable logic circuit to any one of said plural unit circuits an operation time measurer configured to measure operation times of said plural unit circuits on said programmable logic circuit, and a clock-and-voltage supplier configured to obtain both a frequency using said operation times and a voltage value using said operation times, and supply the clock signal having the frequency and the voltage having the voltage value to said programmable logic circuit.

According to another aspect of the invention, there is provided a method of changing an operating voltage of a programmable logic circuit having a circuit configuration that is reconfigurable during operation when plural unit circuits are operated in a time-sharing manner on said programmable logic circuit using each of circuit configuration data corresponding to each of the plural unit circuits, said method comprising measuring operation times for each of said plural unit circuits, calculating a new frequency of a clock signal supplied to said programmable logic circuit, using said operation times, finding a new operating voltage necessary to operate said programmable logic circuit at said frequency and changing the operating voltage and the clock signal supplied to said programmable logic circuit to the new operating voltage and the new frequency.

It is to be understood that both the foregoing general description of the invention and the following detailed description are exemplary, but are not restrictive, of the invention.

BRIEF DESCRIPTION OF THE DRAWINGS

A better understanding of the present invention will become more apparent from the following detailed description read in conjunction with the accompanying drawings, in which.

DETAILED DESCRIPTION OF THE PREFERRED EMBODIMENTS

In each embodiment of the present invention, a programmable logic circuit capable of altering achieved circuit functions during operation is used. This programmable logic circuit can change the achieved circuit functions by reconfiguring the configuration of the whole or part of the circuit during operation. Examples include a FPGA (field programmable gate array) and a DPGA (dynamically programmable gate array) designed to be capable of quickly implementing reconfiguration of the circuit configuration. These arrays are hereinafter referred to simply as programmable logic circuits (PLC).

Figure 2:
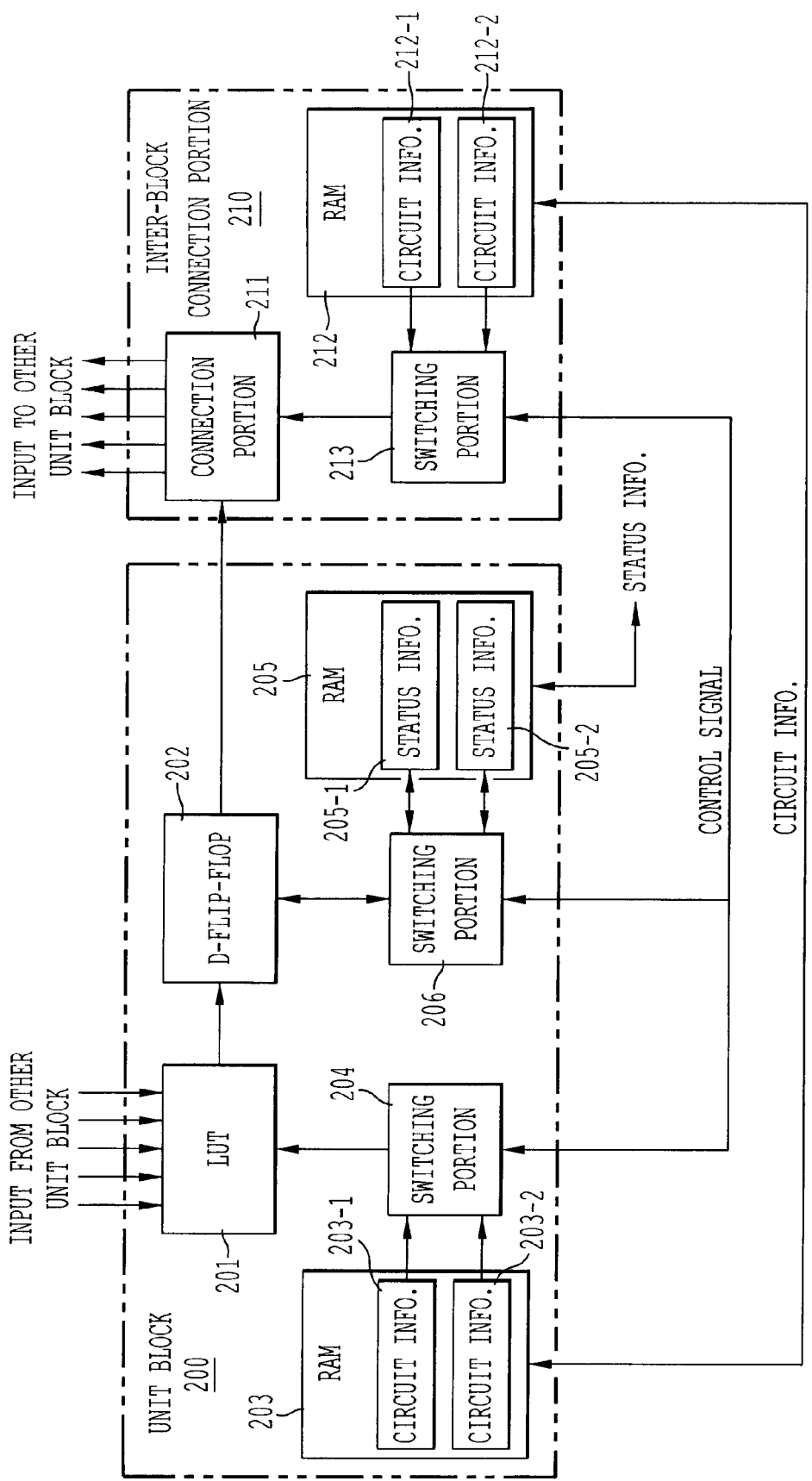
FIG. 2 is a block diagram of one example of a programmable logic circuit used in the first embodiment.

FIG. 2 is a block diagram of a part of the structure of a programmable logic circuit. This logic circuit has plural unit blocks 200 (one shown) and an inter-block connection portion 210 for controlling flow of information between the unit blocks 200. The unit blocks 200 deliver results of logical calculations using input information.

Each unit block 200 of the programmable logic circuit has a look-up table (LUT) 201 performing logical calculations on input data based on given information (hereinafter often referred to as "circuit information") about the circuit configuration and a D-flip-flop 202 for synchronizing the output when the results of the calculations performed by the LUT 201 are output to the next stage of unit block 200 via the inter-block connection portion 210. Each unit block 200 has a RAM (Random Access Memory) 203 for storing plural pieces of circuit information and a switching portion 204 for switching the circuit information supplied to the LUT 201. Each unit block 200 has a RAM 205 and a switching portion 206. The RAM 205 saves the status information about the D-flip-flop 202 when the circuit information supplied to the LUT 201 is switched. The switching portion 206 switches the status information about the D-flip-flop 202. The switching portion 206 stores the status information regarding the D-flip-flop 202 into the RAM 205 and restores the status information stored in the RAM 205 to the D-flip-flop 202.

The inter-block connection portion 210 has a connection portion 211 for controlling the flow of information between the unit blocks 200 according to given circuit information, a RAM 212 for storing plural pieces of circuit information, and a switching portion 213 for switching the circuit information supplied to the connection portion 211.

Outputs from the plural unit blocks 200 are entered into the LUT 201 of one unit block 200. The LUT 201 performs logical calculations using the input data. The LUT 201 delivers the results of the calculations to the connection portion 211 via the D-flip-flop 202. The connection portion 211 delivers the results of the logical calculations to one or more unit blocks 200 specified by the circuit information.

The programmable logic circuit defines the contents of logical calculations performed by each unit block 200 according to circuit information supplied externally. The programmable logic circuit achieves a complex circuit by combining the unit blocks 200. The circuit achieved by the programmable logic circuit according to the circuit information is hereinafter referred to as the "unit circuit". The programmable logic circuit achieves the unit circuit according to circuit information supplied from the outside. When another circuit information is supplied, the programmable logic circuit achieves another unit circuit according to the other circuit information.

A procedure of reconfiguring the circuit configuration during operation of the programmable logic circuit is hereinafter described. It is assumed that the reconfiguration is controlled by a control portion (not shown). Information about a circuit operated after switching includes circuit information 203-2, status information 205-2, and circuit information 212-2.

(A) The control portion supplies information about the circuit to be operated next from the outside to the RAMs 203, 205, and 212. The control portion supplies circuit information 203-2 to the RAM 203. The control portion supplies status information 205-2 to the RAM 205. The control portion supplies the circuit information 212-2 to the RAM 212.

(B) The control portion stops the supply of the clock signal to the programmable logic circuit to stop the processing of the programmable logic circuit.

(C-1) The control portion sends a control signal to the switching portion 206. The switching portion 206 saves the status information 205-1 held in the D-flip-flop 202 to the RAM 205.

(C-2) The control portion sends a control signal to the switching portion 204. The switching portion 204 copies the circuit information 203-2 stored in the RAM 203 into the LUT 201.

(C-3) The control portion sends a control signal to the switching portion 213. The switching portion 213 supplies the circuit information 212-2 stored in the RAM 212 to the connection portion 211.

(D) The control portion sends a control signal to the switching portion 206. The switching portion 206 restores the status information 205-2 stored in the RAM 205 onto the D-flip-flop 202.

(E) The control portion resumes the supply of the clock signal.

Reconfiguration of the circuit configuration of the programmable logic circuit is carried out in the procedure described so far. The processing (A) above can be omitted where the RAMs 203, 205, and 212 already hold the circuit information 203-2, status information 205-2, and circuit information 212-2.

The programmable logic circuit can quickly reconfigure the circuit configuration owing to a feature of the RAMs 203 and 205. In various embodiments of the invention, the RAMs 203 and 205 are mounted. These RAMs 203 are not essential. Reconfiguration can also be accomplished by sending and receiving circuit information and status information at high speed from outside the programmable logic circuit.

In FIG. 2, the number of kinds of information stored in the RAMs 203 and 205 is two, i.e., circuit information and status information. More kinds of information may be stored. The number of kinds of information that can be stored in the RAMs 203 and 205 may be determined according to the speeds at which the circuit information and status information are sent and received from the outside.

Figure 3:
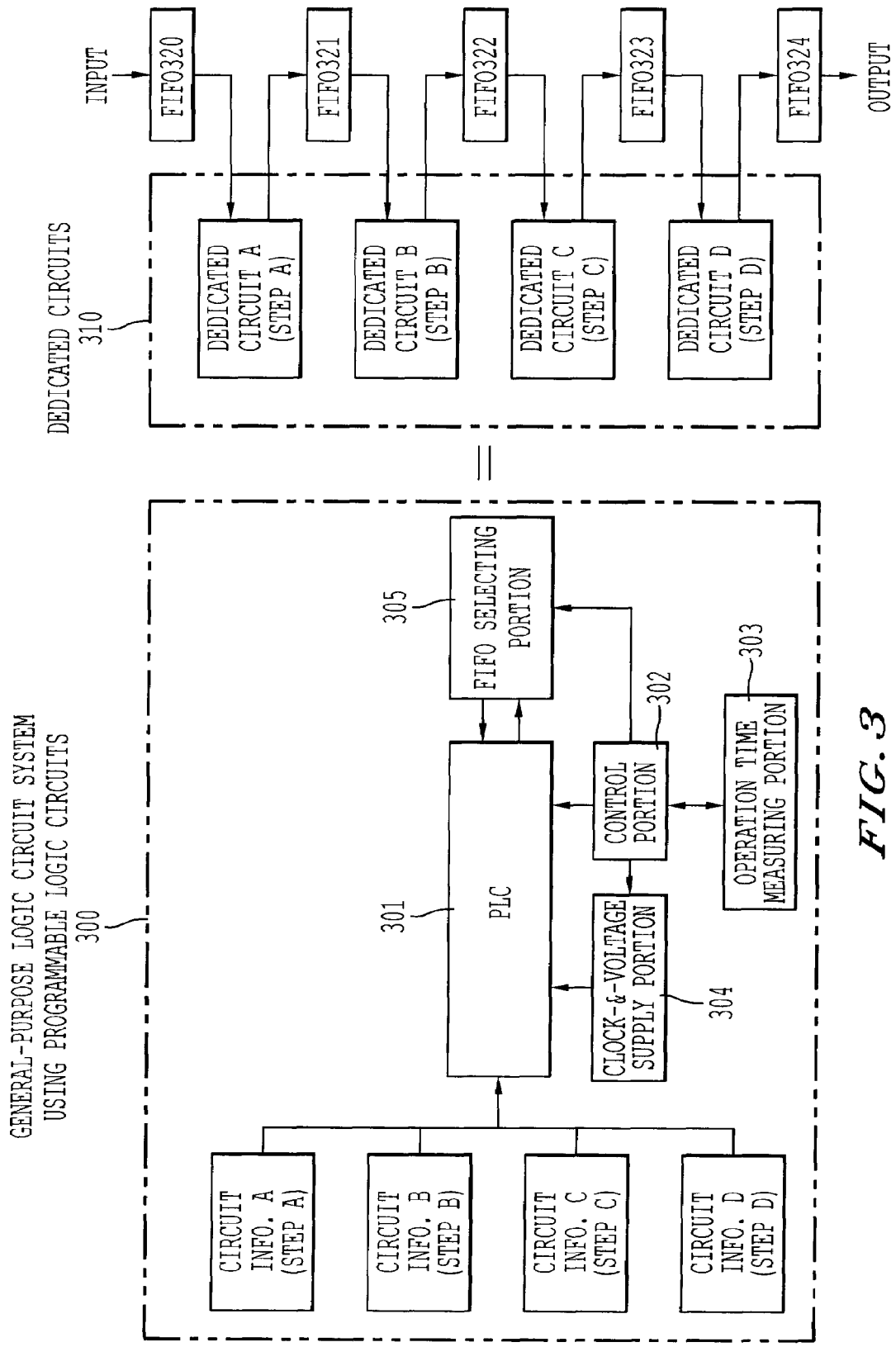
FIG. 3 is a high-level block diagram illustrating a logic circuit system according to the first embodiment.

FIG. 3 schematically shows the functions of the logic circuit systems of the various embodiments of the invention.

FIG. 3 shows an example of circuit that produces a final output through four processing steps A, B, C, and D when an input is made.

If such a circuit is accomplished by a combination of dedicated circuits, the following configuration is conceivable, for example. A dedicated circuit A for performing the processing step A, a dedicated circuit B for performing the processing step B, a dedicated circuit C for performing the processing step C, and a dedicated circuit D for performing the processing step D are used. The outputs and inputs of the dedicated circuits are connected via FIFOs 321, 322, and 323 to absorb the differences in processing performance between the dedicated circuits and in input/output data rate. Another FIFO 320 is mounted on the input side of the dedicated circuit A. A further FIFO 324 is mounted on the output side of the dedicated circuit D.

Input data is supplied to FIFO 320. The input data is processed by the dedicated circuits A, B, C, and D. Final output is obtained via the FIFO 324.

The logic circuit system of each embodiment of the invention uses a programmable logic circuit instead of preparing four dedicated circuits. The four dedicated circuits are treated as unit circuits. Circuit information for realizing the unit circuits by the programmable logic circuit is used. The logic circuit system reconfigures the circuit configuration during operation by supplying circuit information about each unit circuit to the programmable logic circuit. The programmable logic circuit operates while dynamically switching the functions of the unit circuits (hereinafter may be referred to simply as "circuit functions"). That is, the four unit circuits share the programmable logic circuit in a time-sharing manner. This produces the same effect as produced when four dedicated circuits are physically prepared. Thus, the general-purpose logic circuit system using programmable logic circuits 300 produces the same effect as produced by the dedicated circuit 310. The outputs and inputs of the unit circuits are connected via the FIFOs 320, 321, 322, 323, and 324.

The "unit circuit A realized by the programmable logic circuit (PLC) 301" indicates the programmable logic circuit in the state in which the circuit information A is supplied and the circuit is acting as the unit circuit A. The "realization of the unit circuit A by means of the programmable logic circuit" is to realize the circuit functions of the unit circuit A by supplying the circuit information A to the programmable logic circuit.

Each of the four dedicated circuits is herein treated as a unit circuit. The present invention is not limited to this scheme. For example, a circuit obtained by dividing a dedicated circuit or a circuit obtained by combining plural dedicated circuits may be treated as a single unit circuit. The contents of each unit circuit may be determined according to the scale of the circuit of the dedicated circuit, the circuit scale of the programmable logic circuit, the properties of the processing of the process steps, or the flow through the whole processing.

The control portion 302 controls switching of the circuit functions. The control portion 302 also causes the FIFO selecting portion 305 to select an appropriate FIFO according to the circuit realized by the programmable logic circuit 301.

FIGS. 11, 12, 13, and 14 show the manner in which the programmable logic circuit 301 operates while switching the circuit functions from instant to instant.

Figure 11:
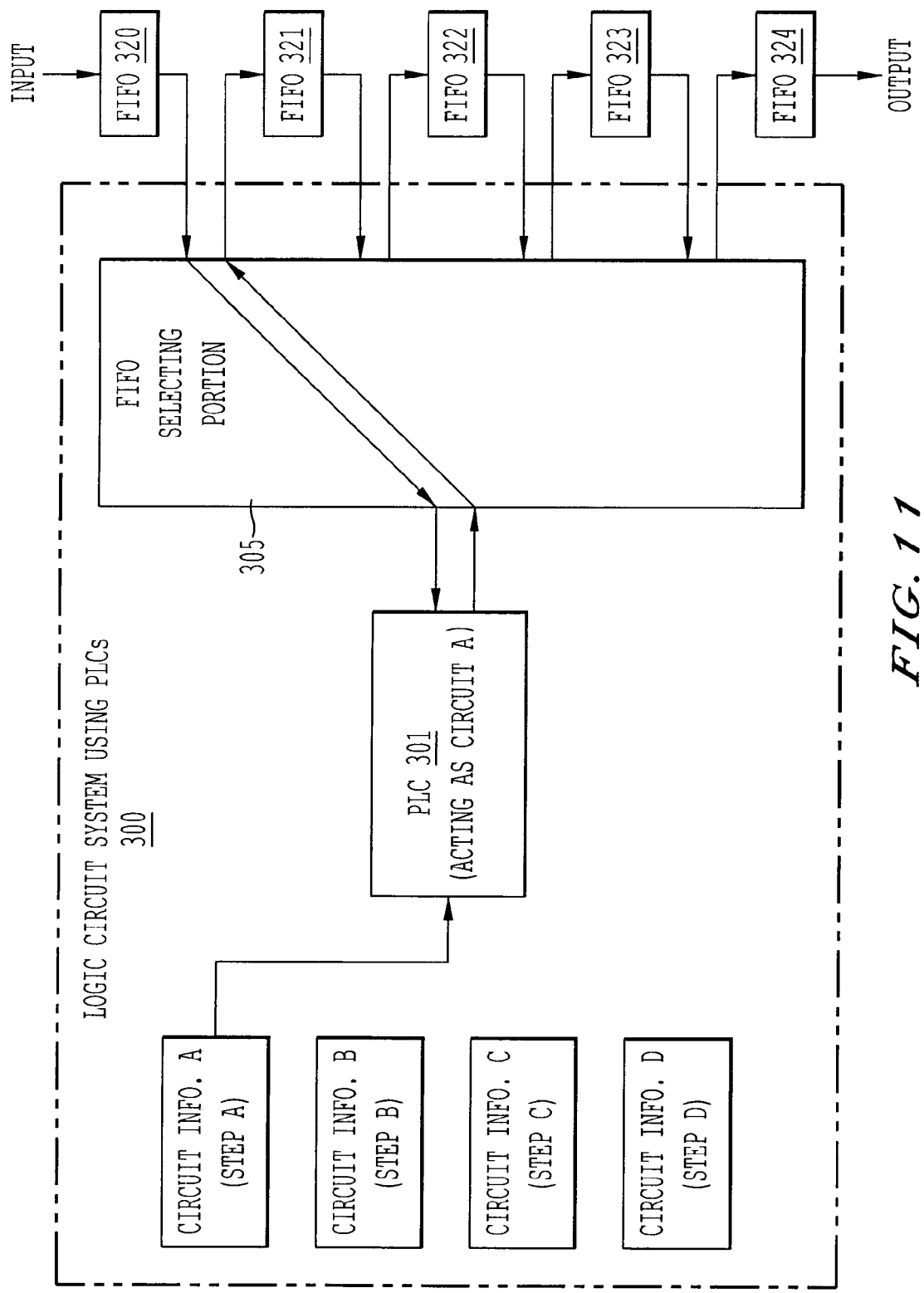
FIG. 11 is a high-level block diagram illustrating an example of the operations of the logic circuit system of respective embodiments of the present invention.

FIG. 11 shows the operation when the circuit information A is supplied to the programmable logic circuit 301. In FIG. 11, the circuit information A is supplied to the programmable logic circuit 301 and so the programmable logic circuit 301 functions as circuit A that performs the processing of step A. The FIFO selecting portion 305 connects the FIFO 320 to the input side of the programmable logic circuit 301 and the FIFO 321 to the output side of the programmable logic circuit 301.

Figure 12:
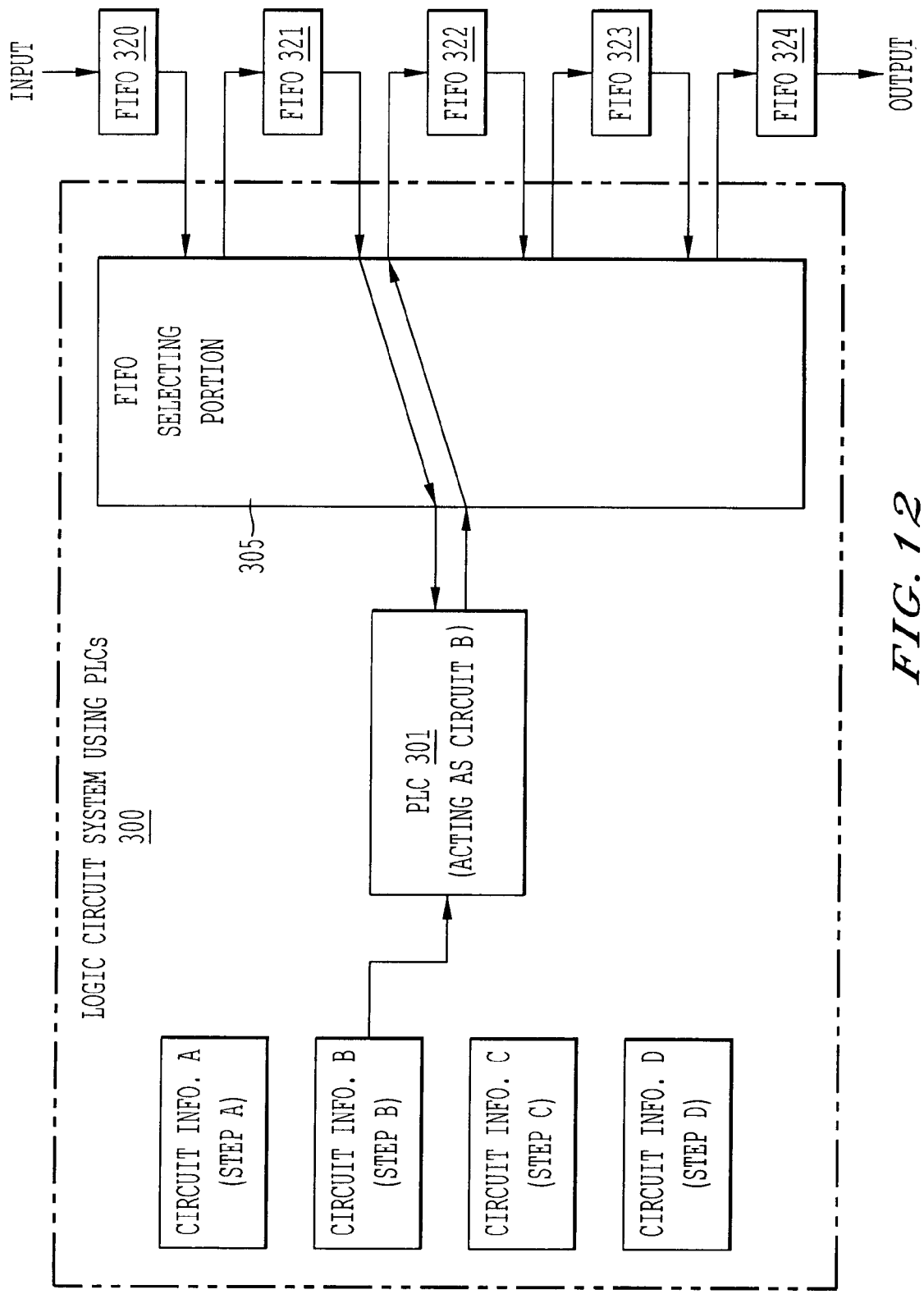
FIG. 12 is a high-level block diagram illustrating another example of the operations of the logic circuit system of respective embodiments of the present invention.

FIG. 12 shows the operation when the circuit information B is supplied to the programmable logic circuit 301. In FIG. 12, the circuit information B is supplied to the logic programmable circuit 301 and so the programmable logic circuit 301 functions as the circuit B that performs the processing of step B. Furthermore, the FIFO selecting portion 305 connects the FIFO 321 to the input and output sides of the programmable logic circuit 301 and the FIFO 322 to the output side of the programmable logic circuit 301.

Figure 13:
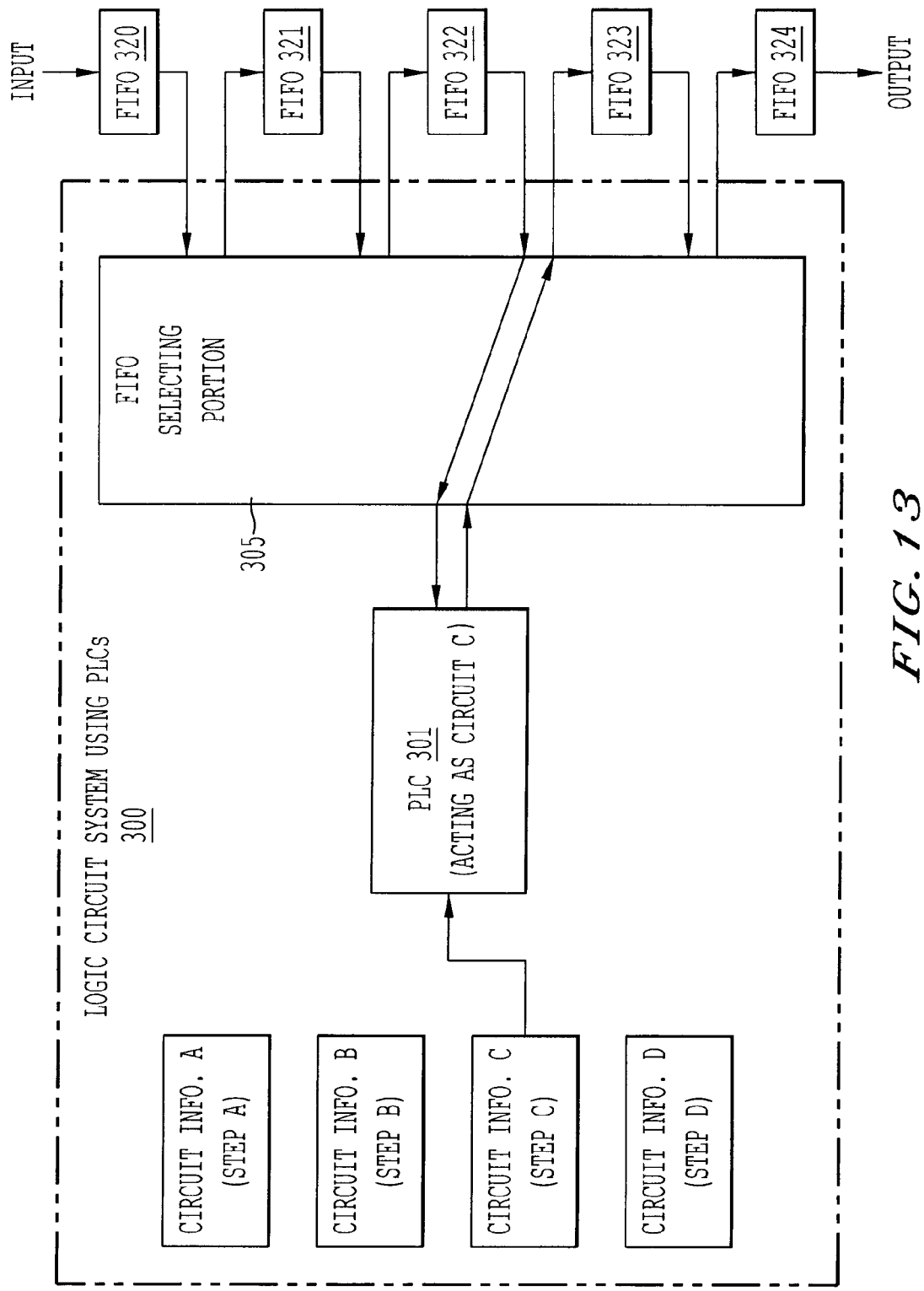
FIG. 13 is a high-level block diagram illustrating another example of the operations of the logic circuit system of respective embodiments of the present invention.

FIG. 13 shows the operation when the circuit information C is supplied to the programmable logic circuit 301. In FIG. 13, the circuit information C is supplied to the programmable logic circuit 301 and the programmable logic circuit 301 functions as circuit C that performs the processing of step C. The FIFO selecting portion 305 connects the FIFO 322 to the input side of the programmable logic circuit 301 and the FIFO 323 to the input and output side of the programmable logic circuit 301.

Figure 14:
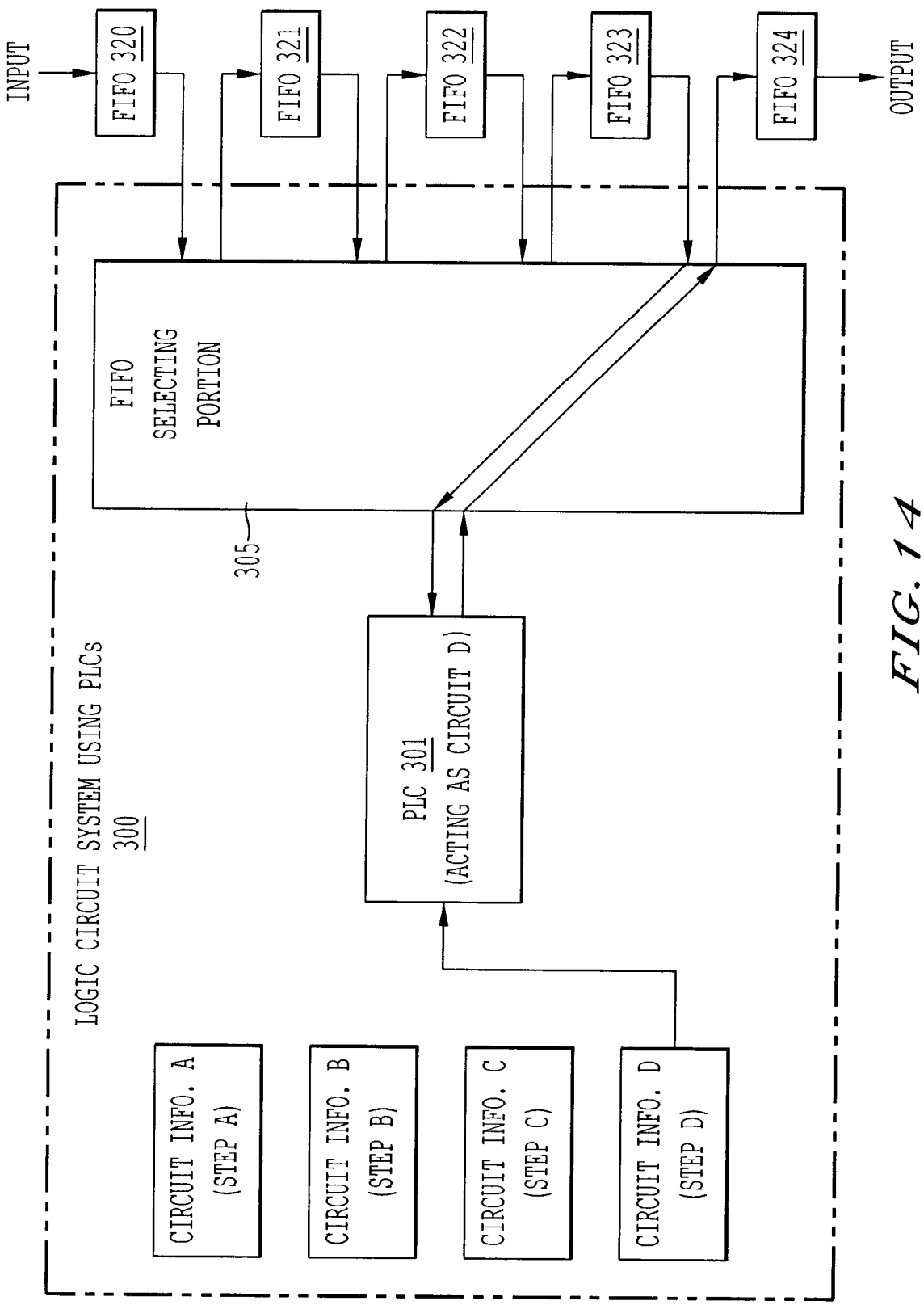
FIG. 14 is a high-level block diagram illustrating another example of the operations of the logic circuit system of respective embodiments of the present invention.

FIG. 14 shows the operation when the circuit information C is supplied to the programmable logic circuit 301. In FIG. 14, circuit information D is supplied to the programmable logic circuit 301 and the programmable logic circuit 301 functions as circuit D that performs the processing of step D. The FIFO selecting portion 305 connects the FIFO 323 to the input side of the programmable logic circuit 301 and the FIFO 324 to the input and output side of the programmable logic circuit 301.

The logic circuit system of each embodiment of the present invention has an operation time measuring portion 303 for measuring the operation time of each unit circuit. The measuring portion 303 measures actual operation times of n unit circuits. In the description provided below, the time for which each unit circuit has actually operated is a time interval from the instant when circuit information about the unit circuit is supplied to the LUTs of the programmable logic circuit to the instant when the supply of the clock signal is stopped to realize a different unit circuit.

The control portion 302 determines the timing of a reconfiguration of the programmable logic circuit. The control portion 302 monitors each of the amount of data stored in each of (n+1) FIFOs. The control portion 302 determines the timing of a reconfiguration of the programmable logic circuit according to each of the amount of data. That is, the control portion 302 schedules the operations of the unit circuits.

Furthermore, the control portion 302 estimates the processing capability required by the programmable logic circuit, using the operation times of the unit circuits. The control portion 302 finds the frequency of the clock signal and operating voltage necessary to realize the estimated processing capability. The control portion 302 then controls the clock-and-voltage supply portion 304, thus modifying the frequency of the clock signal supplied to the programmable logic circuit and operating voltage.

For example, the control portion 302 estimates the processing capability using the sum of the operation times of the unit circuits, the ratios of the operation times of the unit circuits, and the distribution of the operation times of the unit circuits. Where there are plural programmable logic circuits, the control portion 302 estimates the processing capability, also using the sum of the operation times, the ratios of the operation times, and the distribution of the operation times for each individual programmable logic circuit.

First Exemplary Embodiment of a Logic Circuit System

Figure 1:
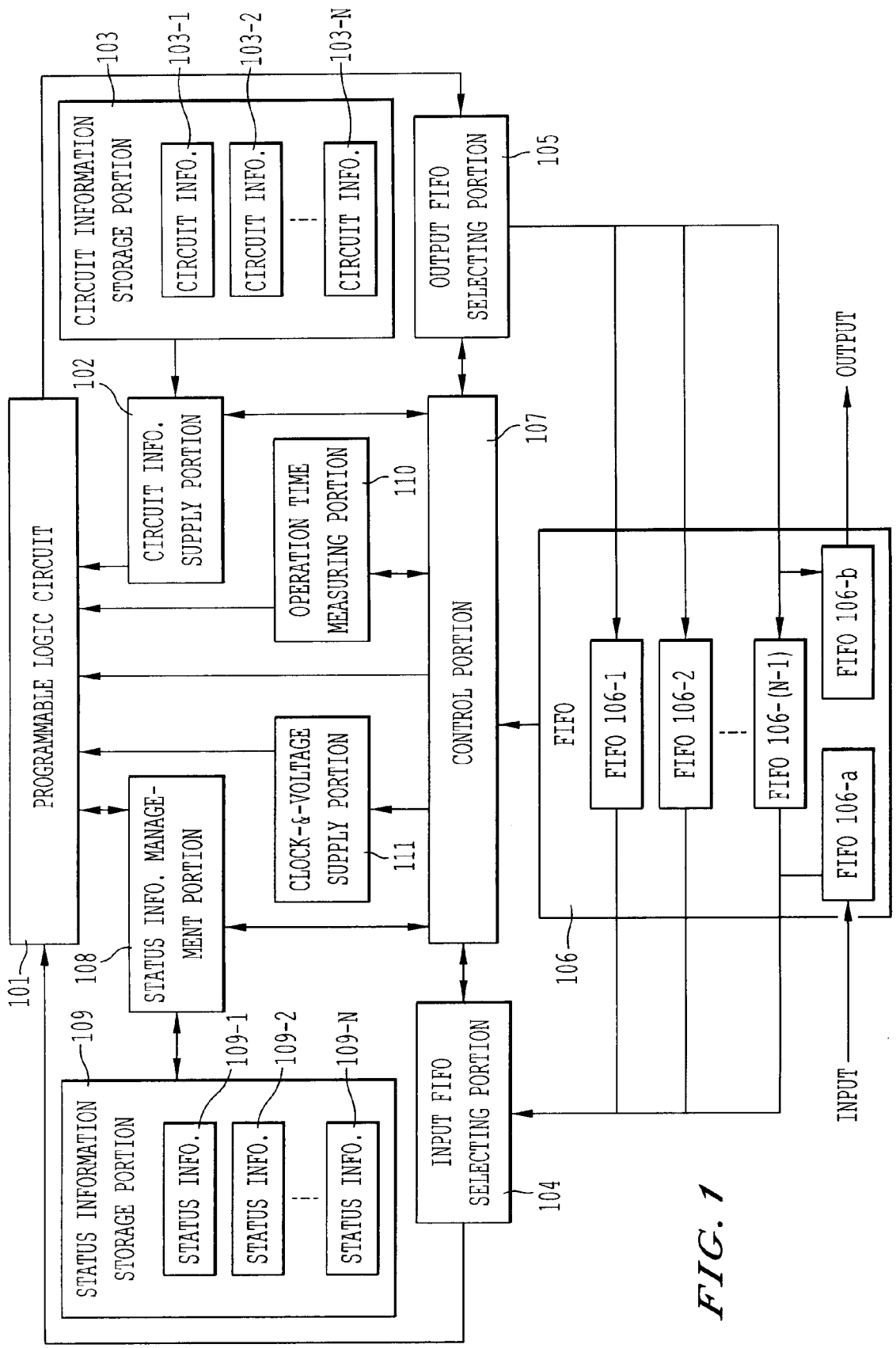
FIG. 1 is a block diagram of a logic circuit system according to the first embodiment.

FIG. 1 shows a logic circuit system using a programmable logic circuit according to a first exemplary embodiment of the present invention. The logic circuit system of the present exemplary embodiment has a programmable logic circuit 101 including an assemblage of the unit blocks 200 of FIG. 2, a circuit information supply portion 102 for supplying circuit information from the outside to the programmable logic circuit 101, and a circuit information storage portion 103 for storing the circuit information.

The logic circuit system of the present exemplary embodiment has FIFOs 106 connecting the unit circuits realized by the programmable logic circuits 101, an input FIFO selecting portion 104 for selecting circuits which are connected with the input sides of the unit circuits realized by the programmable logic circuit 101 from the FIFOs 106, and an output FIFO selecting portion 105 for selecting circuits which are connected with the output sides of the unit circuits realized by the programmable logic circuit 101 from the FIFOs 106.

The logic circuit system of the present embodiment has a status information management portion 108 for managing status information about the programmable logic circuit 101, a status information storage portion 109 for storing the status information, an operation time measuring portion 110 for measuring the operation time of each unit circuit, and a clock-and-voltage supply portion 111 for supplying a clock signal and a voltage necessary for operation to the programmable logic circuit.

The programmable logic circuit 101 performs data processing while switching the functions of the N unit circuits from time to time. The unit circuits realized by the programmable logic circuit 101 read out data necessary for the processing from the FIFOs 106 via the input FIFO selecting portion 104. The unit circuits write data obtained as a result of the processing into the FIFOs 106 via the FIFO selecting portion 105. The programmable logic circuit 101 modifies the circuit configuration in response to a control signal from the control portion 107. For purposes of explanation, the following premises are made in the present example, however the present invention is not limited by these premises:

(A1) All the unit circuits of the present exemplary embodiments are connected in series.

(A2) Each unit circuit of the present exemplary embodiment has one input and one output.

(A3) The whole logic circuit system of the present exemplary embodiment has one input and one output.

The circuit information supply portion 102 reads circuit information of the unit circuit specified by the control portion 107 from the circuit information storage portion 103. The circuit information supply portion 102 supplies the circuit information read out to the programmable logic circuit 101.

The circuit information storage portion 103 stores circuit information 103-1, 103-2, . . . , 103-N. Each of the circuit information 103-1, 103-2, . . . , 103-N corresponds to each of the N unit circuits. The unit circuit realized by the programmable logic circuit 101 using circuit information 103-$k$ is hereinafter referred to as the unit circuit 103-$k$. For purposes of explanation, the following premises are added in the present example, however the present invention is not limited by these premises:

(A4) In the present exemplary embodiment, the unit circuit 103-$k$ performs the processing of the k-th (k=1, 2, . . . , N) step of the data processing performed by the logic circuit system of the present embodiment. The unit circuit 103-N is the closest of the unit circuits to the output side of the whole logic circuit system.

The FIFOs 106 include (N−1) FIFOs (FIFOs 106-1, 106-2, . . . , 106-(N−1)) connecting the N unit circuits. A FIFO 106-$a$ is on the input side of the whole circuit. A FIFO 106-$b$ is on the output side of the whole circuit. For purposes of explanation, the following premises are added in the present example, however, the present invention is not limited by these premises:

(A5) The FIFO connected with the output side of the unit circuit 103-$k$ is the FIFO 106-$k$.

(A6) The FIFO connected with the input side of the unit circuit 103-($k$+1) is the FIFO 106-$k$.

(A7) Each of the FIFOs has the same capacity.

The FIFOs 106 are not limited to a first-in, first-out dedicated memory. A memory such as a DRAM configured or controlled to enable first-in first-out operation is also applicable.

The input FIFO selecting portion 104 selects the input FIFO to be connected with the unit circuit specified by the control portion 107 out of the FIFOs 106. Data is supplied from the selected input FIFO to the specified unit circuit configured on the programmable logic circuit 101.

The output FIFO selecting portion 105 selects the output FIFO to be connected with the unit circuit specified by the control portion 107 out of the FIFOs 106. The data that is output from the specified unit circuit configured on the programmable logic circuit 101 is stored in the selected output FIFO.

The status information management portion 108 reads status information of the unit circuit specified by the control portion 107 from the status information storage portion 109 and supplies the status information to the programmable logic circuit 101. Furthermore, the status information management portion 108 reads the status information of the unit circuit specified by the control portion 107 from the programmable logic circuit 101 and stores the status information into the status information storage portion 109.

The status information storage portion 109 stores status information 109-1, 109-2, . . . , 109-N corresponding to the N unit circuits, respectively. The status information corresponding to the circuit information 103-$k$ is hereinafter referred to as the status information 109-$k$.

The operation time measuring portion 110 measures the operation time of each of the unit circuits and stores the measured operation times. The measured operation times can be referenced from the control portion 107.

The clock-and-voltage supply portion 111 supplies a clock signal and a voltage to the programmable logic circuit 101.

The control portion 107 monitors the amount of data held in the FIFOs 106-1, 106-2, . . . , 106-(N−1), 106-$a$, and 106-$b$. The control portion 107 selects the unit circuit realized by the programmable logic circuit 101. The control portion 107 provides control when the unit circuit realized by the programmable logic circuit 101 is switched. The control portion 107 stores identifiers for the unit circuits operating in the programmable logic circuit 101.

The control portion 107 checks the operation time of each of the unit circuits using the operation time measuring portion 110. The control portion 107 estimates the voltage (operating voltage) supplied to the programmable logic circuit 101 and the frequency (clock frequency) of the supplied clock signal, using the operation times of the unit circuits. The control portion 107 informs the clock-and-voltage supply portion 111 of the estimated operating voltage and clock frequency.

According to the notification, the clock-and-voltage supply portion 111 modifies the operating voltage and clock frequency.

When a new unit circuit starts to operate under the unit circuit-switching control provided by the programmable logic circuit 101, the control portion 107 informs the operation time measuring portion 110 of the identifier of the unit circuit that has started operating. In response to the notification, the operation time measuring portion 110 measures the operation time of the unit circuit.

When the operation of the unit circuit is stopped under the unit circuit-switching control provided by the programmable logic circuit 101, the control portion 107 informs the operation time measuring portion 110 of the stoppage of the operation. In response to the notification, the operation time measuring portion 110 stops the measurement of the operation time of the unit circuit.

Figure 4:
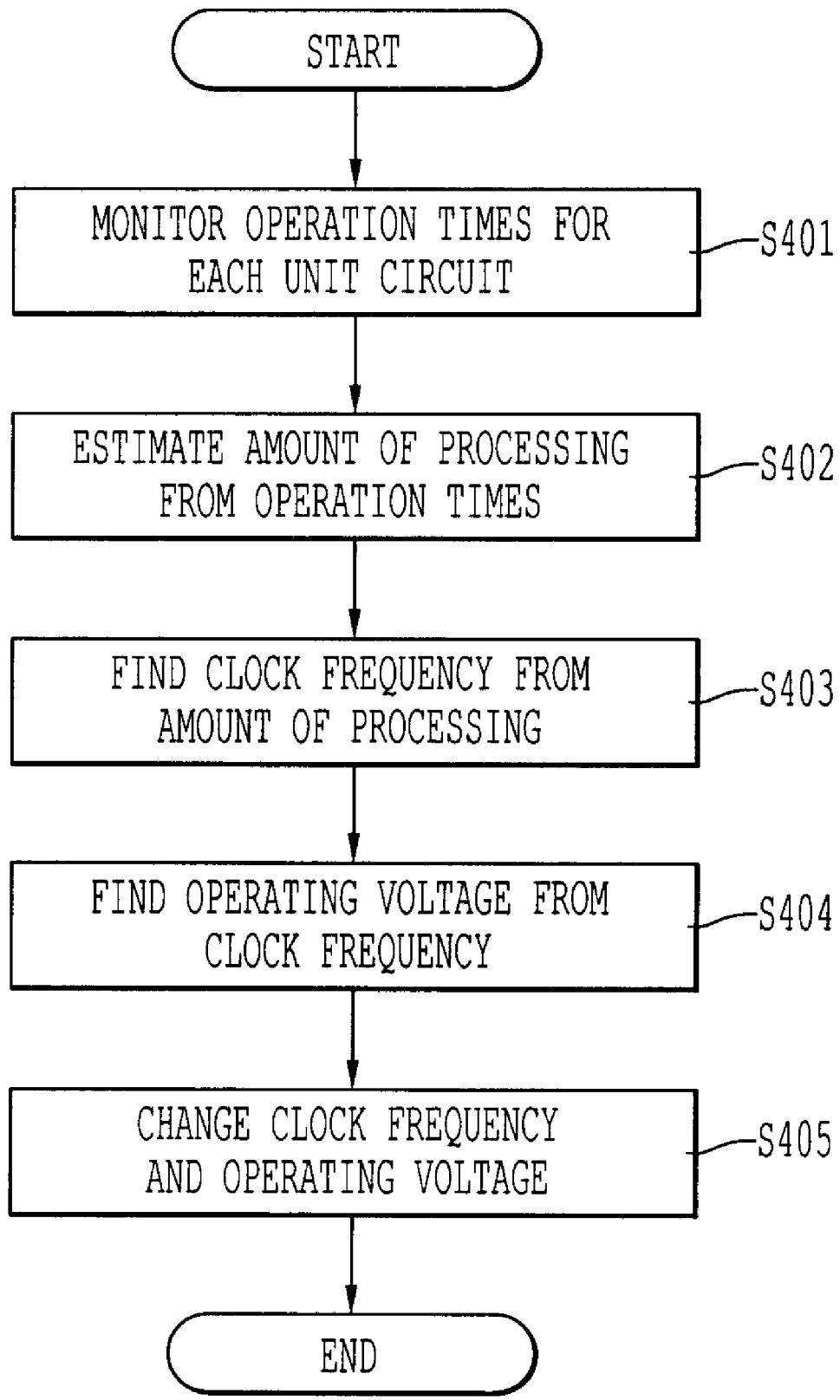
FIG. 4 is a flow chart of a process for finding a clock frequency and operating voltage of the first embodiment.

FIG. 4 is a flowchart illustrating processing of the control portion 107 to find the clock frequency and operating voltage, using the operation times of the unit circuits. The processing of the control portion 107 for finding the clock frequency and operating voltage is described below with reference to FIG. 4.

(Step 401)

The control portion 107 monitors the operation time of each unit circuit held in the operation time measuring portion 110 per a given time. In the present exemplary embodiment, the control portion 107 monitors the operation times per a given time. The time intervals of monitoring may be variable. Furthermore, the control portion may monitor when some event has occurred, for example, when the unit circuit realized by the programmable logic circuit 101 is switched.

(Step 402)

The control portion 107 estimates the amount of processing of each unit circuit. In the present exemplary embodiment, the amount of processing is defined as the product of the operation time and clock frequency. The amount of processing is not limited to the product of the operation time and clock frequency. The product may be found using a function reflecting the characteristics of the unit circuits or a conversion table. Alternatively, the product may be found from the amount of input data and the amount of output data.

(Step 403)

The control portion 107 finds the clock frequency of the programmable logic circuit 101, using the estimated amount of processing. In the present embodiment, the control portion 107 finds a clock frequency sufficient to perform a slightly larger amount of processing than the total of the estimated amounts of processing for the same time as the time interval for which operation times are monitored. In the present exemplary embodiment, the control portion 107 finds a clock frequency sufficient to perform 5% greater amount of processing than the total of the estimated amounts.

The control portion 107 first finds the sum of the amounts of processing of all the unit circuits. The control portion 107 finds an increased amount of processing by multiplying the sum of amounts of processing by 105%. In the present exemplary embodiment, the amount of processing is the product of the clock frequency and the operation time and so the control portion 107 finds a new clock frequency by dividing the increased amount of processing by the monitor time interval.

In the present exemplary embodiment, the increased amount of processing is set to 5%. This value may be appropriately varied. Furthermore, the value may not be restricted to a fixed ratio. The range of increase may be dynamically varied according to variation in the amount of processing. In addition, the amount may not be determined by a ratio; a fixed amount of processing may be added.

Alternatively, the sum of amounts of processing may be increased or reduced using another index such as the amounts of data stored in the FIFOs. A new clock frequency may be found by dividing the amount of processing by the monitor time interval.

(Step 404)

The control portion 107 finds the operating voltage supplied to the programmable logic circuit 101 from the found clock frequency. Generally, the relation between the clock frequency and operating voltage depends on the kind or type of the programmable logic circuit 101. Accordingly, the control portion 107 may find the voltage using a function or conversion table created by referring to a table sheet or the like.

(Step 405)

The control portion 107 informs the clock-and-voltage supply portion 111 of the found operating voltage and clock frequency. The clock-and-voltage supply portion 111 modifies the clock frequency and operating voltage.

As described above, the logic circuit system of the present exemplary embodiment can automatically vary the clock frequency and operating voltage according to the processing capability imposed on the programmable logic circuit and, therefore, the power consumption can be reduced.

Second Exemplary Embodiment of a Logic Circuit System

Figure 5:
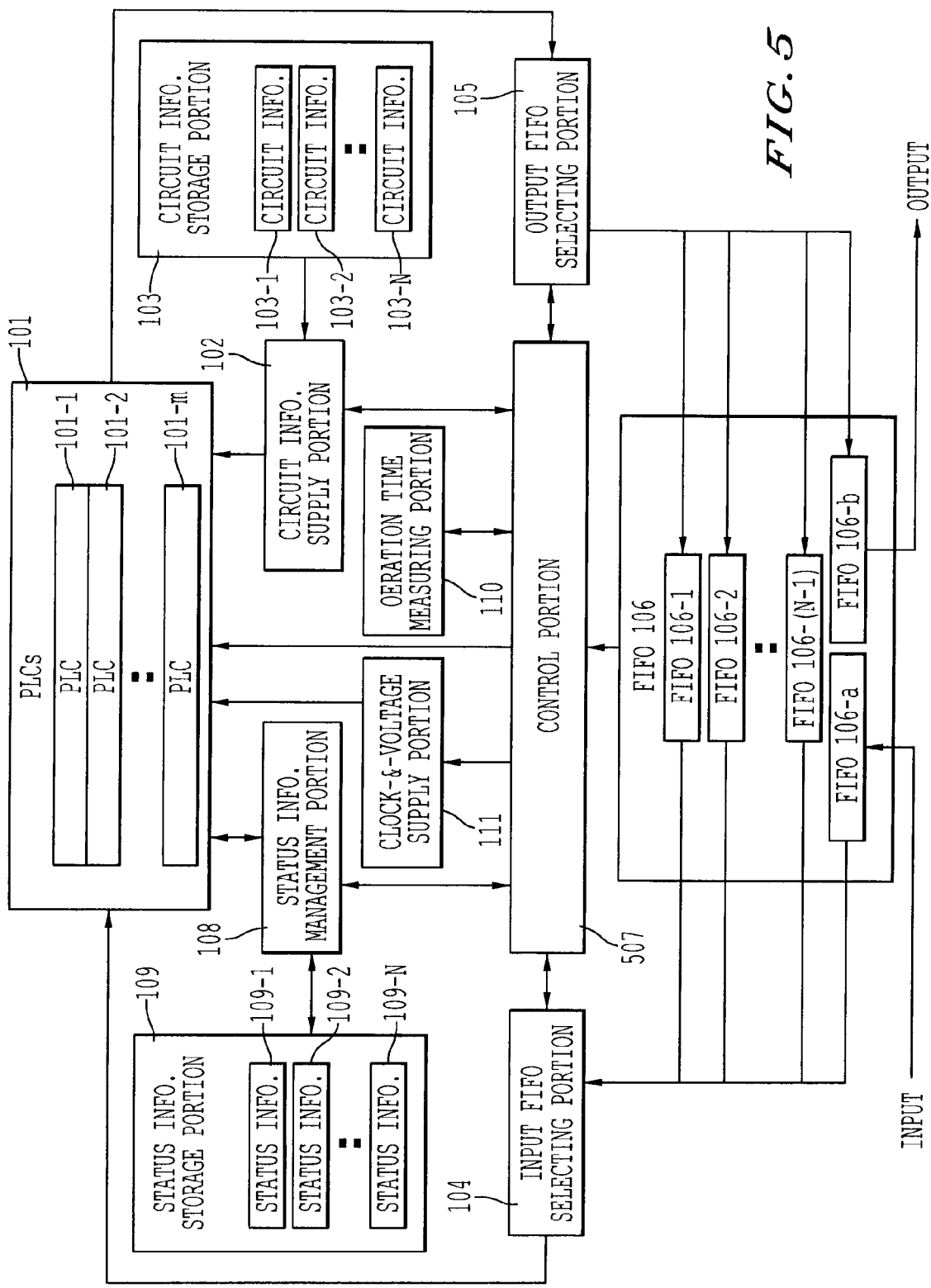
FIG. 5 is a block diagram of a logic circuit system according to the second embodiment.

A logic circuit system of a second exemplary embodiment of the present invention is described below. The present exemplary embodiment differs with the first exemplary embodiment in the number of programmable logic circuits. In the present exemplary embodiment, there are plural programmable logic circuits. So the structure of a control portion 507 is different from that of the control portion 107 of the first exemplary embodiment. FIG. 5 shows the structure of the logic circuit system of the present exemplary embodiment.

The logic circuit system of the present exemplary embodiment can operate plural unit circuits at the same time. The control portion 507 determines an assignment of unit circuits to programmable logic circuits 101-1, 101-2, . . . , 101-m. Note that the initial values may be predetermined.

Where there are plural programmable logic circuits, the control of the clock frequency and operating voltage as described in the first exemplary embodiment may be provided for each individual programmable logic circuit. However, where it is possible to reduce the operating voltages of all the programmable logic circuits at the same time, there is the advantage that the number of components necessary to adjust the clock frequency and voltage can be reduced. In the present exemplary embodiment, it is assumed that all programmable logic circuits operate with the same frequency of clock signal and same operating voltage. A technique of adjusting the clock frequency and operating voltage in this case is described below.

Figure 7:
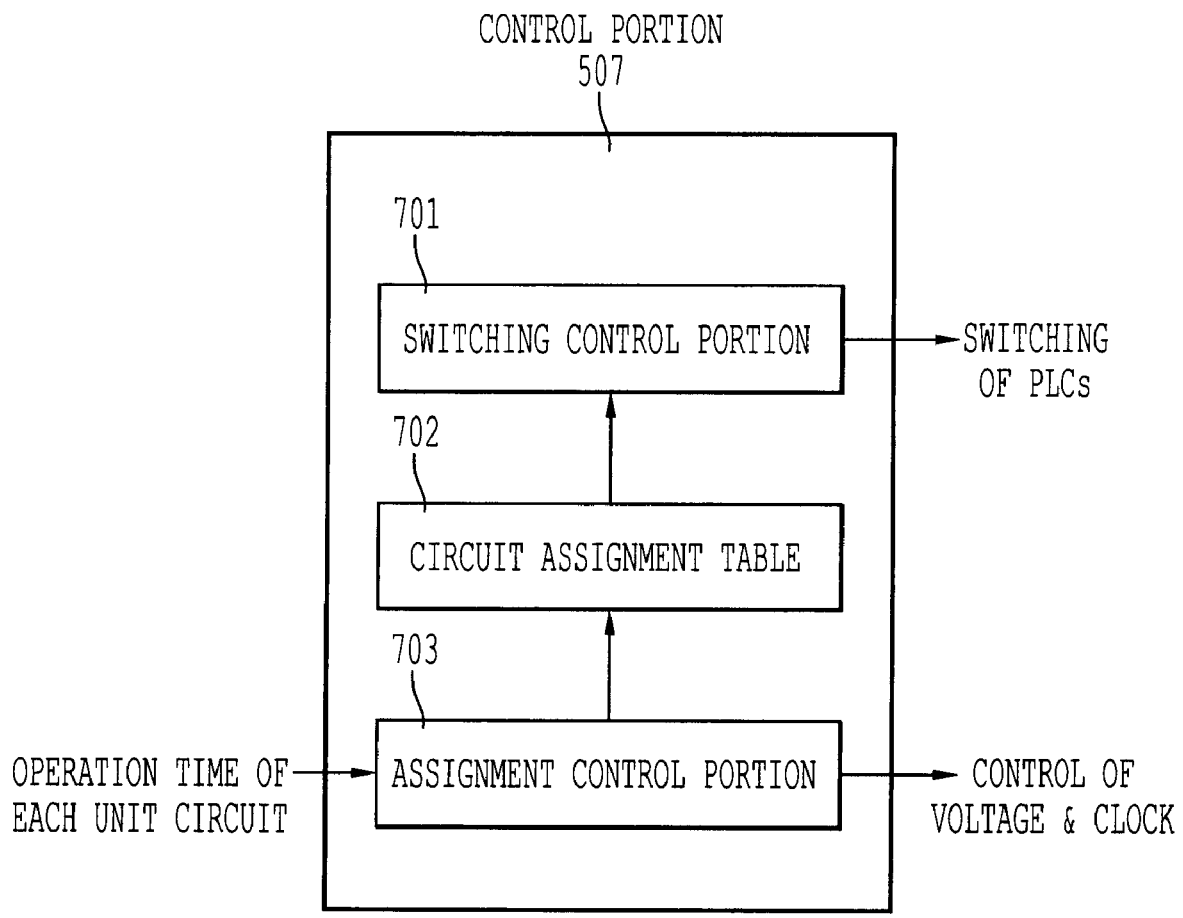
FIG. 7 is a block diagram of a control portion according to the second embodiment.

FIG. 7 shows the configuration of the control portion 507 of the present embodiment. The control portion 507 has a switching control portion 701 for switching the unit circuit operated by each programmable logic circuit, a circuit assignment table 702 storing the relation between each programmable logic circuit and a unit circuit operated on the programmable logic circuit, and an assignment control portion 703 for modifying the assignment of the unit circuits to the programmable logic circuits, the operating voltages of all the programmable logic circuits, and the clock frequency.

Figure 6:
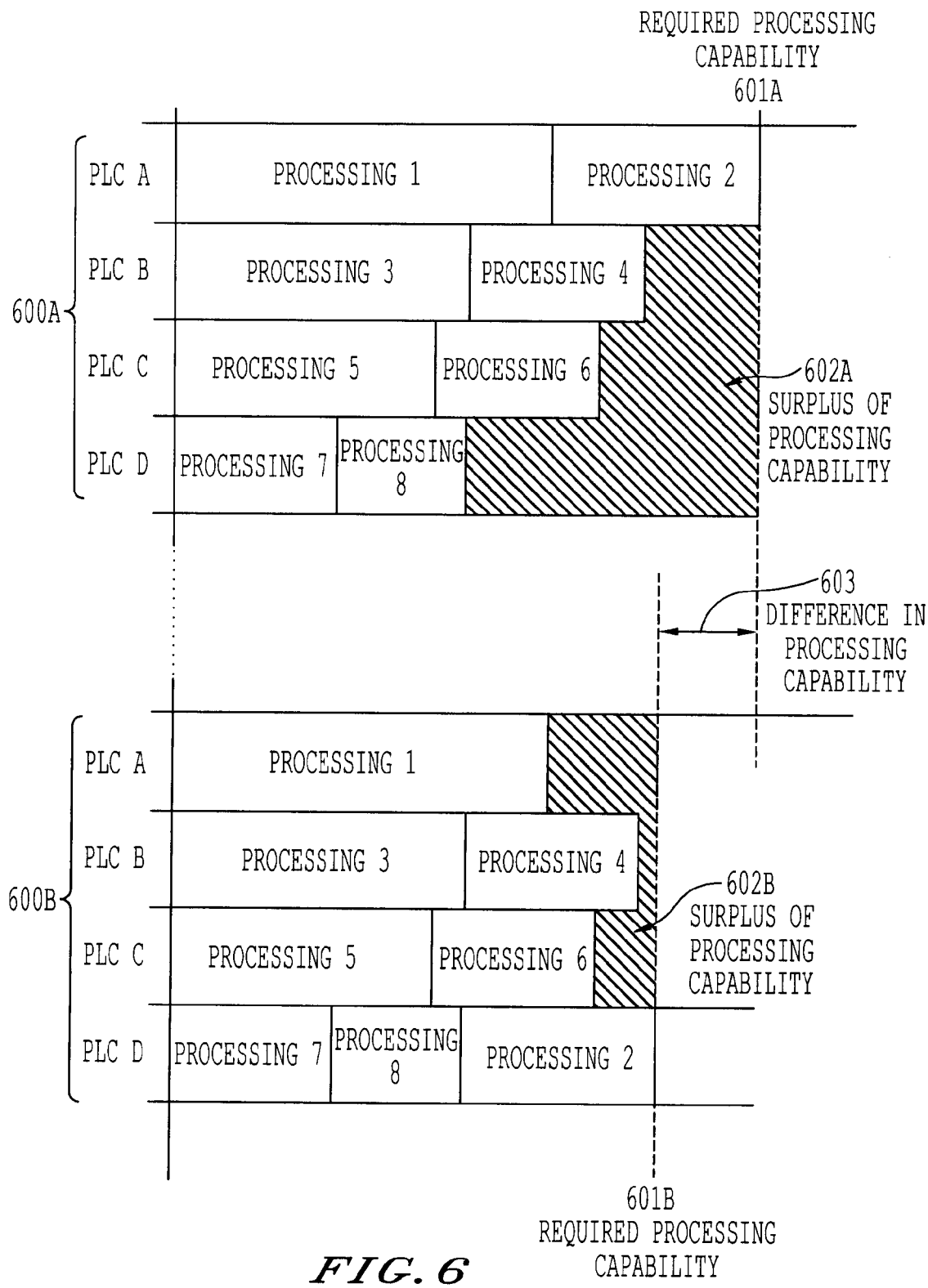
FIG. 6 is a diagram showing a summary of assignment adjustment of unit circuits.

FIG. 6 illustrates the processing performed by the assignment control portion 703. For purposes of explanation, FIG. 6 shows an example in which there are four programmable logic circuits, however, the present invention is not limited to this case. The assignment control portion 703 reduces the surplus of the processing capability by adjusting the assignment of the unit circuits to the programmable logic circuits. This reduces the clock frequency and operating voltage and thus reduces the power consumption.

A graph 600A indicates the processing capability imposed on each programmable logic circuit prior to adjustment of the assignment of the unit circuits. A graph 600B indicates the processing capability imposed on each programmable logic circuit after the adjustment of the assignment of the unit circuits.

On the graph 600A, load is concentrated in the programmable logic circuit A. The programmable logic circuit A requires high processing capability. The operating voltage and clock frequency need to be set such that the programmable logic circuit A can have the required processing capability 601A. The operating voltage and clock frequency are common to all the programmable logic circuits. As a result, programmable logic circuits B, C, and D also have high processing capabilities.

However, the programmable logic circuits B, C, and D do not require as high processing capability as the logic circuit A. Especially, the programmable logic circuit D uses only half or below of the processing capability. Therefore, on the graph 600A, the processing capability has a large amount of surplus 602A.

Accordingly, in this example the assignment control portion 703 assigns processing 2 assigned to the programmable logic circuit A on which the highest processing capability is imposed to the programmable logic circuit D on which the lowest processing capability is imposed. The graph 600B indicates a graph obtained after the adjustment.

On the graph 600B, the processing capabilities imposed on the programmable logic circuits are almost flat or almost equivalent between the programmable logic circuits. It is required that the operating voltage and clock frequency are set so that the programmable logic circuit D can have the required processing capability 601B. Since the required processing capability 601B is lower than the required processing capability 601A, the operating voltage and clock frequency can be made lower than prior to the adjustment. The surplus 602B of the processing capability is lower than the surplus 602A of the processing capability. As a whole, the operation can be performed at higher efficiency than prior to the adjustment.

The assignment control portion 703 stores the assignment of the unit circuits made after adjustment into the circuit assignment table 702. The control portion 703 informs the clock-and-voltage supply portion 111 of the estimated operating voltage and clock frequency.

The switching control portion 701 provides a unit circuit-switching control for switching the unit circuit operated in each programmable logic circuit based on the assignment of the unit circuits stored in the circuit assignment table 702.

Figure 8:
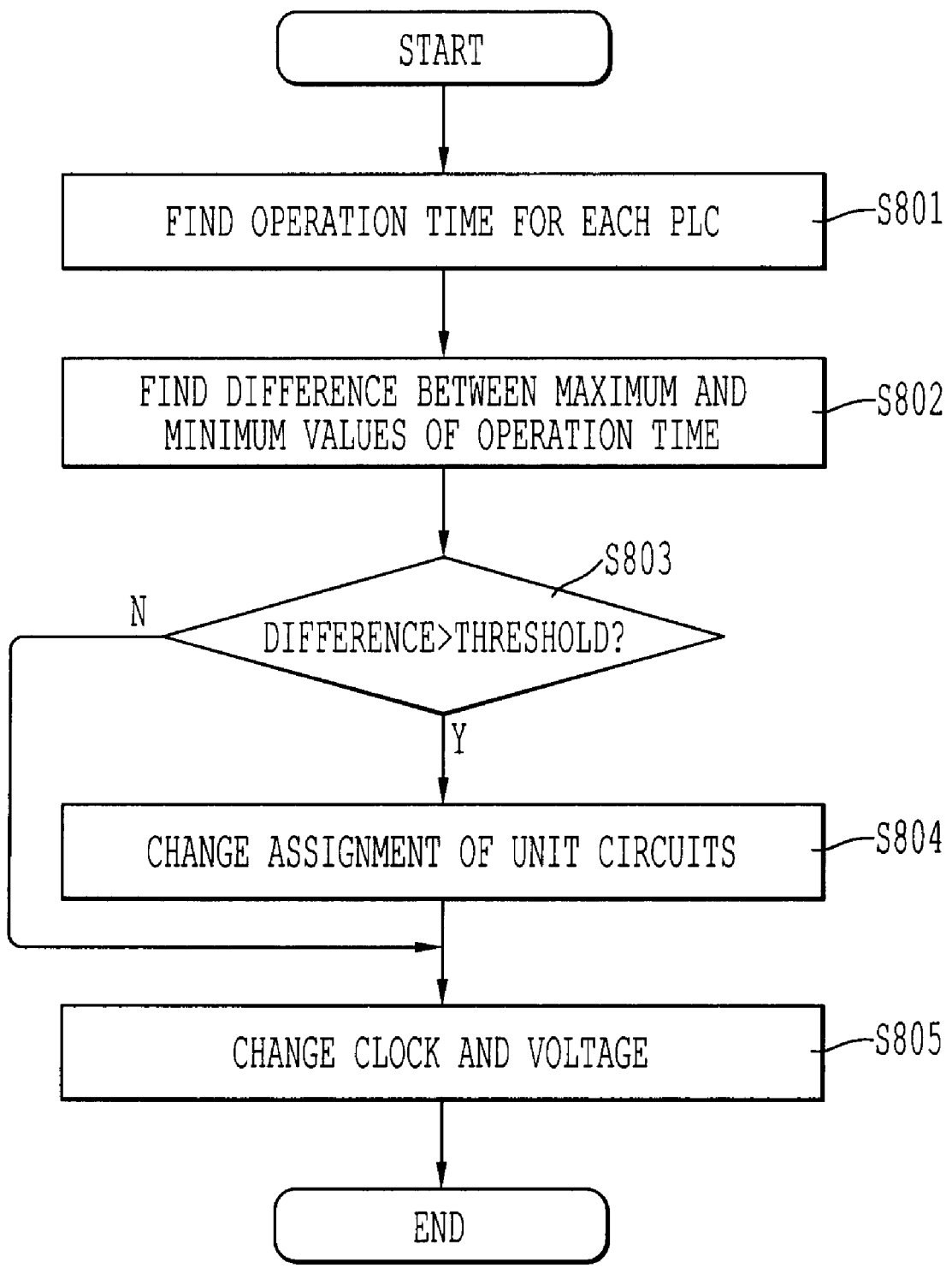
FIG. 8 is a flow chart of a process for finding a clock frequency and operating voltage of the second embodiment.

FIG. 8 is a flowchart of processing for adjusting the assignment of unit circuits performed by the assignment control portion 703. The processing of the assignment control portion 703 is described below with reference to the figure.

(Step 801)

The assignment control portion 703 finds the total operation times of the programmable logic circuits. The control portion 703 checks the operation times of the unit circuits, using the operation time measuring portion 110, and totals the operation times of the unit circuits for each programmable logic circuit to find the total operation time of each programmable logic circuit.

(Step 802)

The assignment control portion 703 finds maximum and minimum values of the total operation time and calculates the difference between them.

(Step 803)

The assignment control portion 703 compares the difference between the maximum and minimum values of the total operation time with a threshold value. Where the difference is less than the threshold value, the control portion 703 performs processing of step 805. Where the threshold value is exceeded, the control portion performs processing of step 804.

(Step 804)

The assignment control portion 703 modifies the assignment of the unit circuit. The control portion 703 assigns one of the unit circuits assigned to the programmable logic circuit of a maximum total operation time to the programmable logic circuit of a minimum total operation time.

The assignment control portion 703 selects the one of the unit circuits having an operation time closest to a half of the difference between the maximum and minimum values of the total operation time. The method of selecting a unit circuit is not limited to this scheme. The unit circuit may be selected at random. Also, the unit circuit having the longest operation time or shortest operation time may be selected. In addition, plural unit circuits may be selected.

(Step 805)

The assignment control portion 703 modifies the operating voltage and clock frequency of the programmable logic circuit 101. Where the assignment is modified, the assignment control portion 703 finds the clock frequency and operating voltage, using the maximum value of the total operation times of the programmable logic circuits after the reassignment. The clock frequency and operating voltage are found in the same way as in the first exemplary embodiment.

Where the assignment is not modified, the clock frequency and operating voltage are found, using the maximum value of the present total operation times of the programmable logic circuits.

Where there are plural programmable logic circuits, the logic circuit system of the present exemplary embodiment can suppress the maximum value of the required processing capability by dispersing the processing among the programmable logic circuits as described above.

Consequently, the clock frequency and operating voltage can be automatically varied according to the processing capability imposed on the whole system. Hence, the power consumption can be reduced.

Third Exemplary Embodiment of a Logic Circuit System

A logic circuit system of a third exemplary embodiment of the present invention is described below with reference to FIG. 9. The logic circuit system of the present exemplary embodiment is identical in configuration with the second exemplary embodiment. The operation of the assignment control portion 703 is different.

Figure 9:
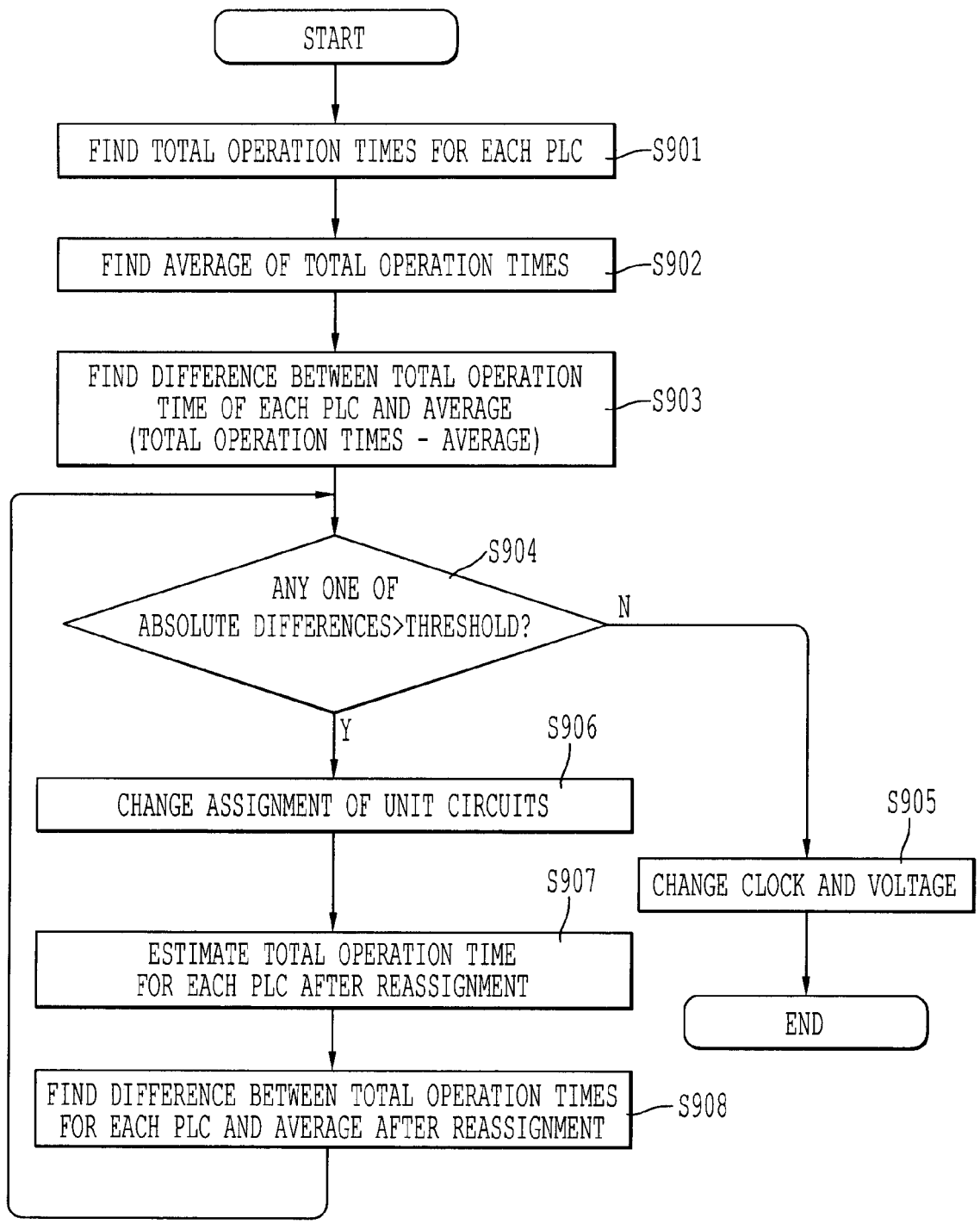
FIG. 9 is a flow chart of a process for finding a clock frequency and operating voltage of the third embodiment.

FIG. 9 is a flowchart of processing performed by the assignment control portion 703 of the present exemplary embodiment to adjust the assignment of the unit circuits.

(Step 901)

The assignment control portion 703 finds the total operation time of each programmable logic circuit. The total operation time of each programmable logic circuit is found by totalizing the operation times of the unit circuits for each programmable logic circuit.

(Step 902)

The assignment control portion 703 finds the average of the total operation times of all the programmable logic circuits.

(Step 903)

The assignment control portion 703 obtains the difference between the total operation time of each programmable logic circuit and the average total operation time. The assignment control portion 703 subtracts the average total operation time from the total operation time. Therefore, where the total operation time is longer than the average total operation time, the difference is positive.

(Step 904)

The assignment control portion 703 compares the absolute difference with a threshold for each programmable logic circuit to find a programmable logic circuit whose absolute difference exceeds the threshold. The assignment control portion 703 performs processing of step 905 if there is not any such programmable logic circuit. The control portion performs processing of step 906 if there is.

(Step 905)

The assignment control portion 703 finds the clock frequency and operating voltage in the same way as the step 805 of the second exemplary embodiment. Then, the assignment control portion 703 informs the clock-and-voltage supply portion 111 of the found clock frequency and operating voltage.

(Step 906)

Where there is any programmable logic circuit whose absolute difference exceeds the threshold, the assignment control portion 703 modifies the assignment of the unit circuits. The assignment control portion 703 assigns at least one unit circuit assigned to the programmable logic circuit of a maximum operation time to the programmable logic circuit of a minimum operation time in the same way as in the second exemplary embodiment.

(Step 907)

The assignment control portion 703 estimates the total operation time of each programmable logic circuit after the reassignment.

(Step 908)

The assignment control portion 703 finds the difference between the total operation time of each programmable logic circuit and average total operation time of in the same way as in step 903 after the reassignment. The control portion again performs the processing of step 904.

In the above description, the number of repetitions of the loop including the steps 904, 906, 907, and 908 is not limited. In alternative embodiments of the system, the number of repetitions may be limited, or a method of increasing the threshold used in step 904 according to the number of repetitions may be used to prevent an endless loop.

Furthermore, in step 906, the assignment control portion 703 may assign the unit circuit assigned to the programmable logic circuit having total operation time longer than the average total operation time to the programmable logic circuit having total operation time shorter than the average total operation time. The programmable logic circuit having total operation time longer or shorter than the average total operation time may be selected at random. Also, the programmable logic circuit having a total operation time different from the average total operation time to the greatest extent (greatest or shortest) may be selected. Alternatively, plural programmable logic circuits each having the longest total operation time may be selected, or programmable logic circuits each having higher or lower total operation time than some reference value may be selected.

As described so far, the logic circuit system of the present exemplary embodiment can suppress the maximum value of the required processing capability in case there are plural programmable logic circuits, by dispersing the processing to the programmable logic circuits.

In consequence, the clock frequency and operating voltage can be automatically varied according to the processing capability imposed on the whole system. Hence, the power consumption can be reduced.

Fourth Exemplary Embodiment of a Logic Circuit System

A logic circuit system of a fourth exemplary embodiment of the present invention is described below with reference to FIG. 10. In the present exemplary embodiment, it is assumed that the operation times of the unit circuits should be close to assumed values under an ideal state. Where the balance between the operation times of the unit circuits is poor, the assignment of the unit circuits to the programmable logic circuits is modified.

The logic circuit system of the present exemplary embodiment is similar in configuration to the second exemplary embodiment except that the assignment control portion 703 holds previously given, assumed values of the operation times of the unit circuits and that the assignment control portion 703 operates differently from the second embodiment.

Figure 10:
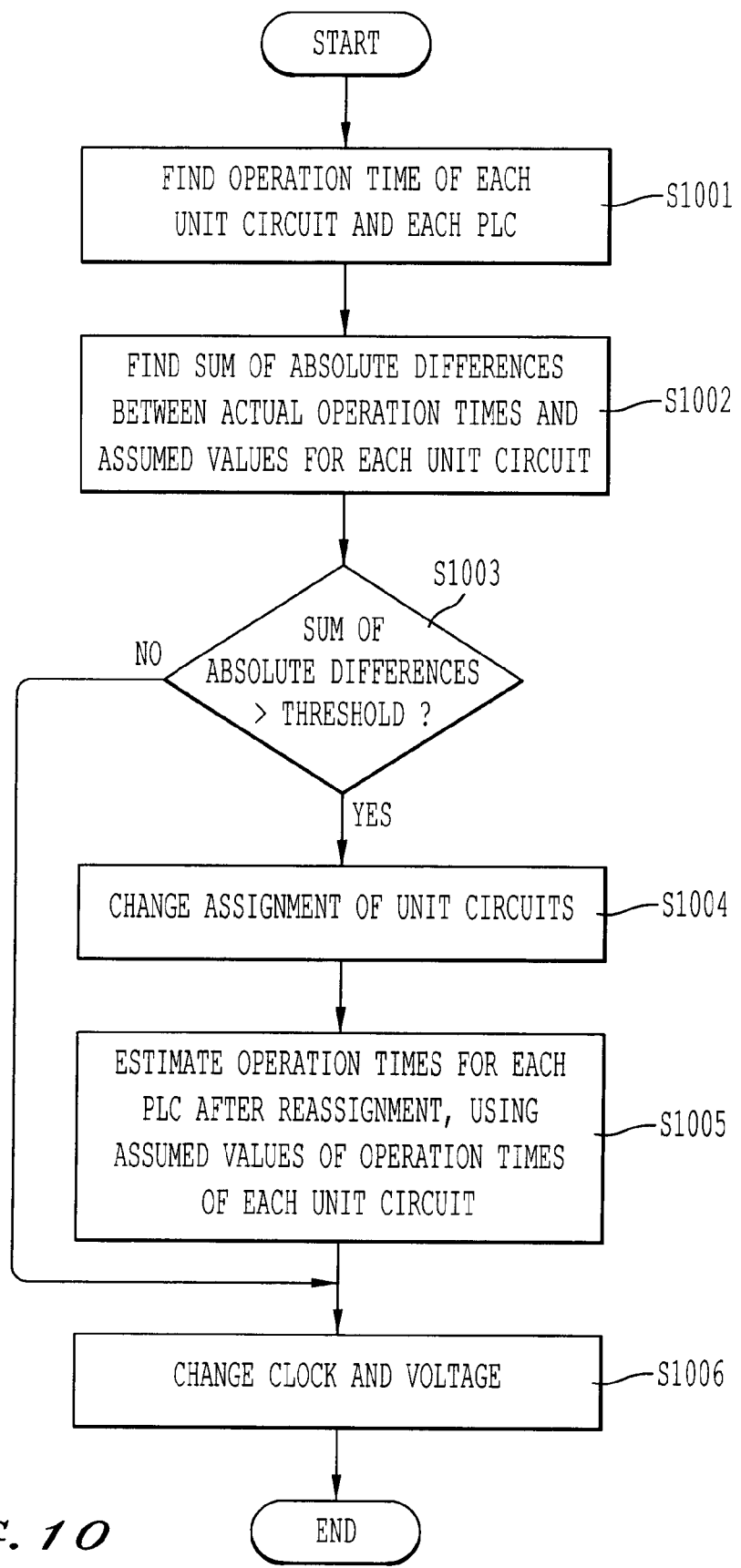
FIG. 10 is a flow chart of a process for finding a clock frequency and operating voltage of the forth embodiment.

FIG. 10 is a flowchart of processing of the assignment control portion 703 of the present exemplary embodiment to adjust the assignment of the unit circuits.

(Step 1001)

The assignment control portion 703 finds the operation time of each unit circuit and the total operation time of each programmable logic circuit.

(Step 1002)

The assignment control portion 703 finds the sum of the absolute differences between the operation times of the unit circuits and their respective assumed values. This sum reflects the degree of balance between the operation times of the unit circuits. If the balance is good, the sum of the absolute values of the differences approaches zero. The sum increases as the balance deteriorates.

(Step 1003)

The assignment control portion 703 compares the sum of the absolute differences with a threshold. Where the sum of the absolute differences is greater than the threshold, the assignment control portion 703 performs processing of step 1004. Where the sum of the absolute values of the differences is smaller than the threshold, the assignment control portion 703 performs processing of step 1006.

(Step 1004)

The assignment control portion 703 modifies the assignment of the unit circuits to the programmable logic circuits. The assignment control portion 703 modifies the assignment target of the unit circuit having the greatest difference between the actual operation time and assumed value. The assignment control portion 703 changes this unit circuit to the programmable logic circuit having the shortest total operation time.

Note that the unit circuit for which the assignment is modified is not limited to one. Plural unit circuits are also possible. Furthermore, the assignment control portion 703 can select the assignment target of the unit circuits at random.

(Step 1005)

The assignment control portion 703 estimates the operation times of the programmable logic circuits after the reassignment, using the assumed values of the operation times of the unit circuits.

(Step 1006)

The assignment control portion 703 finds the clock frequency and operating voltage in the same way as step 805 of the second exemplary embodiment and informs the clock-and-voltage supply portion 111 of the found values.

The sum of the absolute differences is used as an index indicating the degree of balance between the operation times of the unit circuits. The sum of the squared differences may also be used.

As described so far, the logic circuit system of the present exemplary embodiment can automatically vary the clock frequency and operating voltage according to the processing capability imposed on the whole system while maintaining ideal operation times of the unit circuits. Consequently, the circuits can be operated at appropriate voltages corresponding to the processing capabilities. Hence, the power consumption can be reduced.

Where there are plural programmable logic circuits, the logic circuit system of the present exemplary embodiment can suppress the maximum value of the required processing capability by dispersing the processing to the programmable logic circuits as described above.

This makes it possible to vary the clock frequency and operating voltage automatically according to the processing capability imposed on the whole system. Therefore, the power consumption can be reduced.

Furthermore, the aforementioned effect, e.g., decrease in the power consumption, can be obtained while keeping the balance between the operation times of the unit circuits because the difference between the actual operation time and assumed time of each unit circuit is taken into consideration.

Modified Exemplary Embodiments

The logic circuit systems of the exemplary embodiments described so far perform processing only with the programmable logic circuits 101. Logic circuit systems of modifications of the various exemplary embodiments may also use dedicated circuits. In this case, such a logic circuit system treats a dedicated circuit also as a single unit circuit. With this logic circuit system, the clock frequency and operating voltage are modified in the same way as in the exemplary embodiments described so far.

The operation time measuring portions 110 of the logic circuit systems of the exemplary embodiments described so far measure and store the operation times of the unit circuits. The operation time measuring portions 110 of modifications of the exemplary embodiments may measure the operation times within some unit time (e.g., the operation time within the last period of 3 seconds) instead of the operation times themselves. Alternatively, the operation time measuring portions 110 may measure the ratio of the operation time to a predetermined unit time.

The logic circuit system of the fourth exemplary embodiment has taken into account the balance between the operation times of the unit circuits. The logic circuit system of a modification of the fourth exemplary embodiment can also use the number of switching operations as an index indicating the balance. The logic circuit system of the modification may assign the corresponding unit circuit to another programmable logic circuit, in case, for example, the number of switching operations has exceeded a predetermined number.

Each of the logic circuit systems of the second through fourth exemplary embodiments has a plurality of programmable logic circuits. The logic circuit systems of modifications of these exemplary embodiments can also be applied to cases where one programmable logic circuit is partitioned into plural blocks.

In the exemplary embodiments described so far, programmable logic circuits are provided in which each unit block performs logic calculations. Logic circuit systems of modifications of the various exemplary embodiments may have programmable logic circuits of other type. For example, a programmable logic circuit in which each unit block is capable of arithmetic calculations and a programmable logic circuit in which each unit block is capable of performing simple processing in software may also be used.

Numerous modifications and variations of the present invention are possible in light of the above teachings. It is therefore to be understood that within the scope of the appended claims, the invention may be practiced otherwise than as specifically described herein.

The invention claimed is:

1. A power changing apparatus configured to change operating voltages of plural programmable logic circuits when plural unit circuits are operated in a time-sharing manner using the programmable logic circuits, each of the programmable logic circuits having a circuit configuration that is reconfigurable during operation using each of circuit configuration data corresponding to each of the plural unit circuits, power changing apparatus comprising:

an assigning unit configured to assign each of said plural unit circuits to each of said programmable logic circuits;

an operation time measurer configured to measure operation times for each of said plural unit circuits;

a first calculating unit configured to calculate first total operation times for each of said plural programmable logic circuits, each of the first total operation times corresponding to a sum of said operation times for each of said plural programmable logic circuits;

an assignment changing unit configured to change air assignment of said plural unit circuits using said first total operation times;

a second calculating unit configured to calculate second total operation times for each of said plural programmable logic circuits, each of the second total operation times corresponding to a sum of said operation times for each of said plural programmable logic circuits according to the changed assignment;

a clock unit configured to find a frequency of a clock signal supplied to said plural programmable logic circuits using a maximum value of said second total operation times;

an operating voltage unit configured to find operating voltages of said plural programmable logic circuits using said clock frequency; and an operating voltage changer configured to change the operating voltage of each of the programmable logic circuits and the frequency of the clock signal to the found operating voltage and the found frequency, respectively.

2. The apparatus of claim 1, wherein the assignment changing unit is further configured to reassign one or more of said plural unit circuits assigned to the programmable logic circuit having a maximum value of the first total operation times to the programmable logic circuit having a minimum value of the first total operation times.

3. The apparatus of claim 1 further comprising a storage unit configured to store assumed values for each of the operation times of said plural unit circuits, wherein the assignment changing unit changes the assignment when an error between the operation time of each unit circuit and the assumed value is greater than a predetermined threshold.

4. The apparatus of claim 1, wherein the assignment changing unit is further configured to find a reference value for said first total operation times, and change in the assignment in case an error between one of said first total operation times and said reference value is greater than a predetermined threshold.

* * * * *